(12) United States Patent
Jadhav et al.

(10) Patent No.: US 12,408,272 B2
(45) Date of Patent: Sep. 2, 2025

(54) FASTENING ASSEMBLY OF A CIRCUIT-BOARD-MOUNTED COMPONENT AND ELECTRIC MOTOR

(71) Applicant: Brose Fahrzeugteile SE & Co. Kommanditgesellschaft, Würzburg, Würzburg (DE)

(72) Inventors: Vijaykumar Jadhav, Bamberg (DE); Maik Rümmler, Breitengüssbach (DE)

(73) Assignee: Brose Fahrzeugteile SE & Co. Kommanditgesellschaft, Würzburg, Würzburg (DE)

( * ) Notice: Subject to any disclaimer, the term of this patent is extended or adjusted under 35 U.S.C. 154(b) by 217 days.

(21) Appl. No.: 18/366,174

(22) Filed: Aug. 7, 2023

(65) Prior Publication Data
US 2024/0023243 A1    Jan. 18, 2024

Related U.S. Application Data

(63) Continuation of application No. PCT/EP2022/052273, filed on Feb. 1, 2022.

(30) Foreign Application Priority Data

Feb. 5, 2021   (DE) .............. 10 2021 201 100.4

(51) Int. Cl.
*H05K 1/11*      (2006.01)
*H01F 27/06*     (2006.01)
(Continued)

(52) U.S. Cl.
CPC ............. *H05K 1/111* (2013.01); *H01F 27/06* (2013.01); *H01F 27/292* (2013.01); *H05K 1/181* (2013.01);
(Continued)

(58) Field of Classification Search
CPC .............. H05K 1/11; H05K 1/182; H05K 2201/09063; H05K 2201/09072; H05K 2201/09745
See application file for complete search history.

(56) References Cited

U.S. PATENT DOCUMENTS 3,567,844 A * 3/1971 Krcmar ................. H05K 1/116
                                                 174/253
4,034,149 A * 7/1977 Zaleckas ............. H05K 3/3405
                                                 257/786
(Continued)

FOREIGN PATENT DOCUMENTS

DE      3321694 A1   12/1984
DE      9316543 U1    9/1994
(Continued)

*Primary Examiner* — Sherman Ng
(74) *Attorney, Agent, or Firm* — Laurence A. Greenberg; Werner H. Stemer; Ralph E. Locher

(57) ABSTRACT

A fastening assembly of a circuit-board-mounted component, more particularly a choke coil or interference suppression choke, contains: a component having at least one terminal; and a circuit board having at least one soldering surface. At the soldering surface, the terminal of the component is electrically contacted by solder. A longitudinal slot runs parallel to the circuit board plane and is provided in the region of the soldering surface. In the longitudinal slot a peripheral portion of the terminal of the component lies. The peripheral portion extends in the terminal longitudinal direction.

10 Claims, 3 Drawing Sheets

(51) Int. Cl.
*H01F 27/29* (2006.01)
*H05K 1/18* (2006.01)

(52) U.S. Cl.
CPC .................. *H01F 2027/065* (2013.01); *H05K 2201/1003* (2013.01)

(56) References Cited

U.S. PATENT DOCUMENTS

| | | | |
|---|---|---|---|
| 4,254,448 | A | 3/1981 | Martyniak |
| 4,480,384 | A | 11/1984 | Bolzt et al. |
| 8,698,364 | B2 | 4/2014 | Saito et al. |
| 2003/0056975 | A1* | 3/2003 | Kochanowski ........ H05K 1/111 174/250 |
| 2011/0278054 | A1* | 11/2011 | Lee ........................ H05K 1/111 174/250 |

FOREIGN PATENT DOCUMENTS

| | | |
|---|---|---|
| DE | 19522329 A1 | 1/1997 |
| DE | 112009002657 T5 | 6/2012 |
| JP | H031472 U | 1/1991 |

* cited by examiner

FASTENING ASSEMBLY OF A CIRCUIT-BOARD-MOUNTED COMPONENT AND ELECTRIC MOTOR

CROSS-REFERENCE TO RELATED APPLICATION

This application is a continuation, under 35 U.S.C. § 120, of copending International Patent Application PCT/EP2022/052273, filed Feb. 1, 2022, which designated the United States; this application also claims the priority, under 35 U.S.C. § 119, of German Patent Application DE 10 2021 201 100.4, filed Feb. 5, 2021; the prior applications are herewith incorporated by reference in their entirety.

FIELD AND BACKGROUND OF THE INVENTION

The invention relates to a fastening assembly of a circuit-board-mounted component, in particular a choke coil or interference suppression coil, preferably of electronics of an electric motor (motor electronics). It further relates to an electric motor of a motor vehicle, and in particular to a cooling fan motor, with such a fastening assembly.

Electric motors of the this type are used in a wide range of drive systems of a motor vehicle, in particular in the drive for a cooling fan (cooling fan drive or motor), but also, for example, in window lifters, seat adjustment systems, sliding roofs, or fans. Specifically in the case of use in motor vehicles, it is necessary to suppress interference of the electric motor, in particular in order to enable interference-free radio reception (in particular in the VHF range) and interference-free operation of integrated control circuits or the like. The restricting of such radio interference to a permissible level is stipulated in standards.

Electric motors which are used in drives for actuators of a motor vehicle and operated with direct current can be electronically commutated and be brushless or have brushes, and for this purpose have a mechanical commutator, the commutator bars of which are connected to the armature windings of the rotor (rotor winding) and produce a sliding contact with brushes (carbon brushes) of a brush system. Current in the correct phase is supplied, in the case of a brushless electric motor, to its stator winding and, in the case of a brushless electric motor, to its rotor or armature winding as a consequence of rotation of the motor shaft.

Electromagnetic waves in the high-frequency range, which are generated by the electric motor and emitted into the environment, are produced during electromotive operation. This causes interference (radio interference) to technical equipment in the environment of the electric motor, which conflicts with the requirement for electromagnetic compatibility (EMC), namely the need to prevent such electromagnetic interference. In order to produce the EMC of such an electric motor, it is customary to equip the electronics of the electric motor (motor electronics) or the brush system with components for interference suppression (interference suppression elements).

Interference suppression chokes (choke coils), which present a high resistance for high-frequency signals and damp them in order to avoid them being emitted via supply lines while the motor current is flowing through the choke coil with virtually no loss, are also generally used as components for interference suppression, usually as an alternative to or in combination with capacitors in order to damp high-frequency parasitic oscillations. Such an interference suppression choke for an electric motor usually has a coil core (iron core) which is wound with an insulated electrical conductor. The winding or coil ends of the conductor serve as terminals (terminal pins) for contacting the interference suppression coil, for example on a printed circuit board of motor electronics.

In the case of an electric motor with brushes, with a brush system having for example two brushes, such a choke coil is usually assigned to each brush, each choke coil being, on the one hand, joined to the motor terminal (positive pole or negative pole) and, on the other hand, connected to the respective brush. In the electric circuit closed via the commutator of the electric motor, the motor current flows, with respect to the technical direction of flow, starting from the positive pole of the motor voltage via a first choke coil (interference suppression choke) and via the two brushes grinding against the commutator and then via the second choke coil (interference suppression choke) to the negative pole of the motor voltage. Such an electric motor with a brush system and specially arranged interference suppression chokes is known, for example, from published, non-prosecuted German patent application DE 195 22 329 A1 and from German utility model DE 93 16 543 U1.

In the case of a brushless (electronically commutated) electric motor, the activation often takes place with the use of so-called pulse width modulation (PWM) in which electrical square pulses (step signals) with a predetermined or predeterminable duty cycle in the kHz to MHz range are generated which reproduce, for example, a sinusoidal activation characteristic of the electric motor as accurately as possible. Because it is virtually impossible to avoid the emitting of electromagnetic waves in the region of the windings and the supply lines of the electric motor, the electromagnetic waves acting, for example, on the electronics or on other power units and consumer units in the vicinity of the electric motor, reliable interference suppression of such electric machines is necessary.

In the case of an electrical compressor, known for example from published, non-prosecuted German patent application DE 11 2009 002 657 T5, with an electronics housing, the (motor) electronics arranged therein are connected to a coil component in order to eliminate electromagnetic interference, wherein the coil component is fastened to a printed circuit board of the motor electronics.

Whereas, in the case of so-called though-hole technology (THT), the terminals (terminal wires, terminal pins) of electrical or electronic components are routed through placement holes of a printed circuit board and are soldered on their rear side, these are not present in the case of surface-mounted devices (SMDs). Consequently, not only is it possible for the printed circuit board (PCB) to be populated on both sides, but also the electrical properties of circuits which are made are positively influenced, in particular especially in the case of higher frequencies.

Such SMD components are generally assembled, in particular electrically contacted and mechanically fastened (placed), on the printed circuit board in a surface-mount technology (SMT) process by means of placement machines and soldering stations. The connection surfaces of the SMD components on the printed circuit board (PCB) can here be printed before placement with solder or solder paste according to the stencil printing method. After placement, the SMD components are soldered with heat, wherein the reflow method is typically applied for the mounting (placement) on the upper side of the printed circuit board.

Also in the case of electric motors of servo drives of a motor vehicle, the population of the printed circuit board of the motor electronics, which are accommodated in a motor or electronics housing, often takes place using such an SMT process. However, in particular in the case of circular terminals (terminal wires) of the components, their positioning on the respective solder pad (solder cushion, solder area) of the printed circuit board is problematic, which can in turn cause further mounting problems with the motor electronics in the housing or on the heat sink.

Components mounted using the SMT process, such as in particular the choke coils or electrolytic capacitors used as interference suppression elements, therefore typically have flattened terminals in order to enable reliable contacting of the component on the printed circuit board. However, there is here nevertheless the disadvantage that the component to be mounted is shifted or tilted on the printed circuit board during the SMT process, in particular in the case of reflow soldering, which in turn can result in incorrect arrangement and/or fastening and thus in inadequate mounting of the component on the printed circuit board.

SUMMARY OF THE INVENTION

The object of the invention is therefore to provide a particularly suitable fastening assembly of an (electrical or electronic) component, in particular an interference suppression choke or choke coil, on a printed circuit board, preferably of motor electronics of an electric motor.

This object is achieved according to the invention by the features of the independent claim. Advantageous variants and embodiments are the subject matter of the dependent claims (subclaims).

The fastening assembly of a circuit-board-mounted component has an electrical or electronic component or part and a printed circuit board with a mounting side and with a board rear side situated opposite the latter. The component has a base body and at least one terminal, preferably two terminals. The printed circuit board has a solder pad at which the terminal of the component is or can be contacted electrically by means of solder, preferably soldered by means of the reflow method.

An elongated slot running parallel to the plane of the printed circuit board and in which the terminal of the component lies with a peripheral section extending in the longitudinal direction of the terminal is provided in the region of the solder pad, in particular on the mounting side of the printed circuit board. In other words, the terminal of the component bears against the solder pad with no perforation, i.e. does not pass through a placement hole of the printed circuit board in accordance with the through-hole method and is expediently also not soldered on the rear side of the circuit board.

In an advantageous embodiment of the component, its respective terminal has a round, in particular circular terminal cross-section (cross-sectional area). In other words, the terminal does not have to be flattened, which allows a corresponding work or process step to be saved. In particular in the case of a choke coil as a component, the coil ends of the coil winding produced from a round wire provided with an insulation can therefore readily be used as a terminal without any flattening. Considered in cross-section, the peripheral section lying or arranged in the elongated slot in the printed circuit board is a circular segment of the component or part terminal which lies in the elongated slot in the printed circuit board over part of the length, or over the whole length, of the terminal.

The elongated slot can be provided only in the solder pad or in the latter and in the printed circuit board. It is also conceivable that a recess is provided in the printed circuit board in the region of the elongated slot of the solder pad. According to a suitable embodiment, the recess in the printed circuit board and/or the rear side of the board can here have a metal layer on the edge of the recess. The terminal of the component expediently bears against at least one of the slot edges of the elongated slot.

Additionally or alternatively, in the region of the solder pad, a second solder pad parallel to the latter can be provided in the printed circuit board. In this variant, it is advantageous that the terminal of the component is or can be electrically contacted with the second solder pad. The solder can here establish just a connection between the terminal and the inner solder pad (inner layer) on the printed circuit plate, wherein the inner solder pad is then the only solder pad and the upper solder pad may also be omitted. The solder can also establish a connection only to the upper (first) solder pad or to both solder pads.

The component is suitably a choke coil, the coil winding of which forms the base body and the coil ends of which form the respective terminal of the component. The component can also be a choke coil with a coil core (iron core) which, with the coil winding, forms the base body. In addition, the component can be an electrolytic capacitor with two terminals.

According to an advantageous development, a window-like recess which is, for example, completely or partially closed at the periphery and in which the base body of the component sits is introduced into the printed circuit board. Its respective terminal is here routed out of the window-like recess to bear against the solder pad arranged in the region of an edge section of the window-like recess. The component can advantageously be cooled during the soldering process from both sides (of the printed circuit board) by virtue of the arrangement of the component or its base body in the recess in the printed circuit board. In addition, the structure of the fastening assembly in the direction perpendicular to the plane of the printed circuit board is reduced by the thickness of the printed circuit board.

In the case of a choke coil as the component, its terminals are routed, on opposite edge sides of the window-like recess, out of the latter and there to a respective solder pad of the printed circuit board. In the case of a capacitor as the component, its two terminals are routed, on the same side of the window-like recess, out of the latter and there in each case to a solder pad of the printed circuit board at the edge.

The fastening assembly is particularly suited and provided for an electric motor, in particular for a cooling fan motor of a motor vehicle.

Other features which are considered as characteristic for the invention are set forth in the appended claims.

Although the invention is illustrated and described herein as embodied in a fastening assembly of a circuit-board-mounted component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Corresponding parts are provided with the same reference signs in all the figures.

Figure 1:
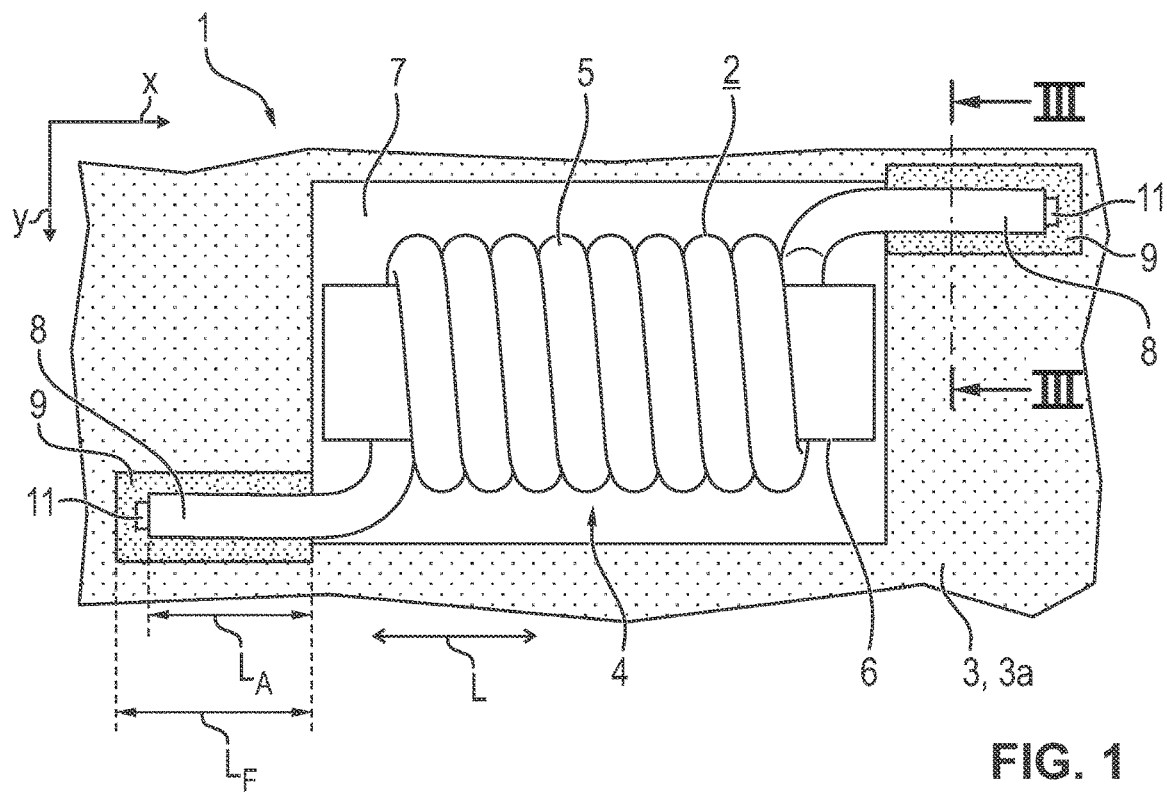
FIG. 1 is a diagrammatic, plan view of a first embodiment of a fastening assembly of a choke coil with a coil core as an electrical or electronic component (part) on a printed circuit board with a window-like recess for receiving the part and with a metallized printed circuit board recess in the region of slotted solder pads for component terminals with a circular terminal cross-section.
Figure 2:
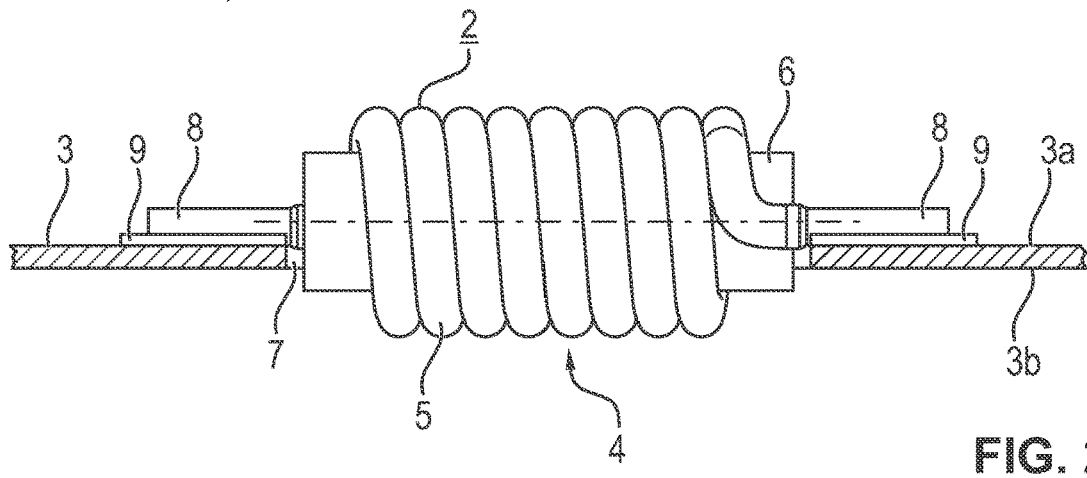
FIG. 2 is side view and partial sectional view of the fastening assembly according to FIG. 1.
Figure 3:
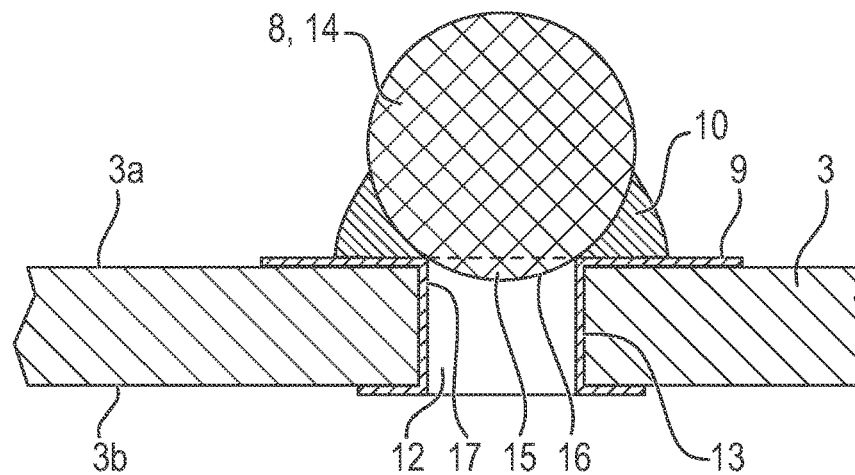
FIG. 3 is a sectional view taken along the line III-Ill shown in in FIG. 1.

Referring now to the figures of the drawings in detail and first, particularly to FIGS. 1-3 thereof, there is shown a plan view, a side view in partial section, and an illustration in section, respectively, of a first embodiment of a fastening assembly 1 of a choke coil with a coil core as an electrical (electronic) component or part 2 on a printed circuit board 3. The printed circuit board 3 has a board surface or mounting side 3a and, situated opposite, a board rear side 3b. The part 2 has a base body 4 which is here formed by the coil core (iron core) 6 wound with a coil or coil winding 5. The fastening assembly 1 is particularly suited for an electric motor, in particular for a cooling fan motor of a motor vehicle. The component 2 is an interference suppression choke.

The printed circuit board 3 has a window-like recess 7 for receiving the component 2, in which recess 7 the component 2 lies with its base body 4. Terminals 8 situated opposite each other of the component 2 are routed out of the recess 7 in the printed circuit board. t edge sides situated opposite each other of the window-like recess 7, the printed circuit board 3 has in each case a solder pad 9 for electrically contacting the respective terminal 8 of the component 2 and for mechanically fastening it on the printed circuit board 3 by means of solder 10. The soldering process preferably takes place by means of the reflow method.

An elongated slot 11 running parallel to the plane xy of the printed circuit board is provided in the region of the respective solder pad 9, here on the mounting side 3a of the printed circuit board 3 (FIGS. 1 and 3). The solder pad 9 extends in the x direction on the mounting side 3a of the printed circuit board 3. This direction here corresponds to the longitudinal direction L of the terminal 8 of the component 2. The length LA of that terminal section with which the terminal 8 corresponds to the solder pad 9, i.e. bears against or on the latter, is smaller in the exemplary embodiment than the length LF of the solder pad 9. The length of the elongated slot 11 here corresponds to approximately the length LA of the terminal 8 or the corresponding terminal section of the component 2. The solder pad 9 thus has an approximately U-shaped surface contour in the plane xy of the printed circuit board.

Aa can be seen from FIG. 2, the component 2 protrudes with its base body 4 from the printed circuit board 3 on its mounting side 3a and on its board rear side 3a. The component 2 can thus be cooled from both sides during the soldering or reflow process. In addition, the structure or the total thickness of the fastening assembly 1 is less, at least by the thickness of the printed circuit board 3, than in the case of a mounting of the component 2 on the mounting side 3a of the printed circuit board 3 with no window-like recess 7.

As can be seen in FIG. 3, in this alternative embodiment the elongated slot 11 is provided both in the solder pad 11 and in the printed circuit board 3. In other words, the elongated slot 11 extends in the region of the solder pad 9 into the printed circuit board 2 and can perforate the latter partially or completely. This printed circuit board recess 12, which is aligned with the elongated slot 11, is preferably provided with a metal layer 13. The latter extends in some regions or partially also onto the board rear side 3b of the printed circuit board 3.

The respective terminal 8 of the component 2 has a round, in particular circular, terminal cross-section (cross-sectional area) 14. The terminal 8 of the component 2 lies in the elongated slot in the printed circuit board with a peripheral section 15 extending in the longitudinal direction L of the terminal. Considered in cross-section, the peripheral section 15, lying in the elongated slot 11 in the printed circuit board, of the terminal 8 is a circular segment of the part terminal 8 with which the terminal 8 lies in the elongated slot 11 in the printed circuit board over its length LA. With respect to the circular terminal cross-section 14, a terminal edge 16 of the terminal 8 of the component 2 thus lies in the elongated slot 11 in the printed circuit board. The component 2 is therefore reliably positioned in its intended position during the soldering or reflow process too.

Pivoting, tilting, or shifting of the component 2 during the mounting or fastening process is thus reliably prevented, especially because the elongated slot 11 effects, or at least assists, as it were auto-alignment of the component 2. Such a component 2 with a round, in particular circular terminal cross-section 14 can therefore also be mounted securely on the printed circuit board 3. In this alternative embodiment, the terminal 8 of the component 2 bears against both of the facing slot edges 17 of the elongated slot 11.

Figure 4:
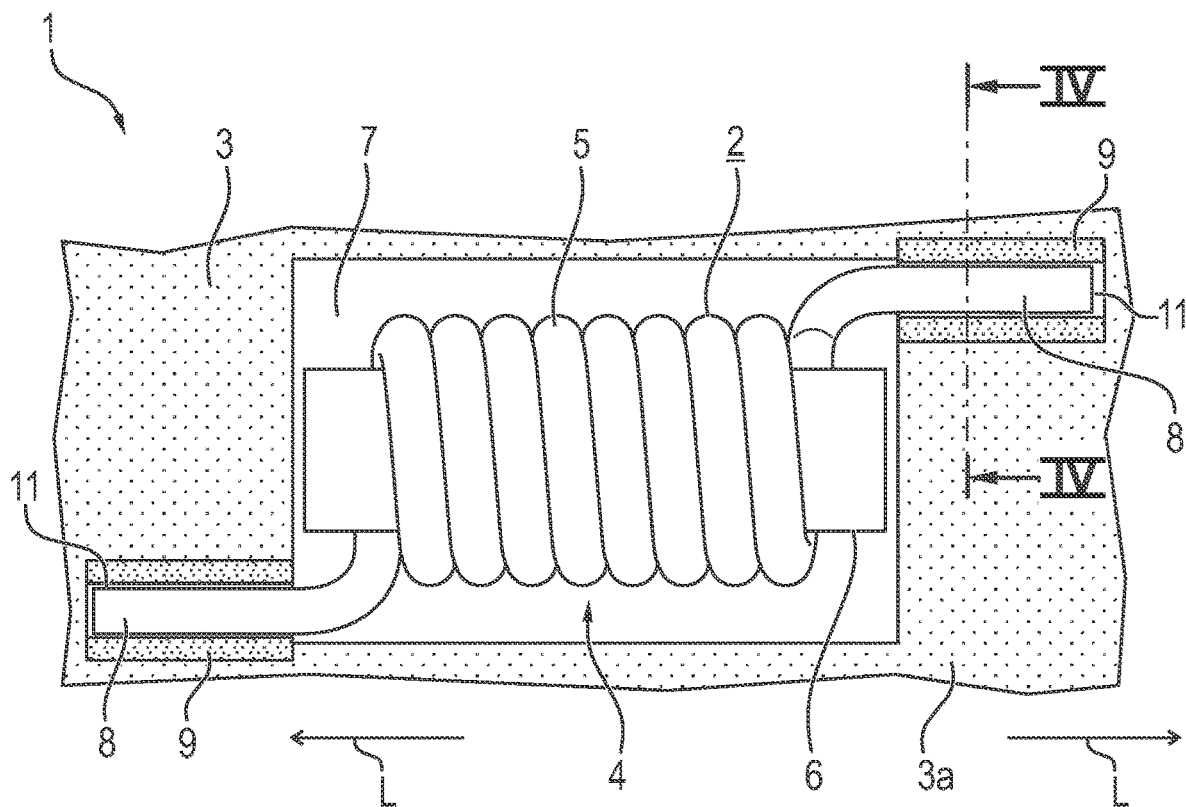
FIG. 4 is a plan view of a second embodiment of the fastening assembly of the choke coil with the coil core as the component on the printed circuit board with the slotted outer solder pad (on the surface or mounting side) and with an inner solder pad for the respective component terminal in the region of a printed circuit board recess.
Figure 5:
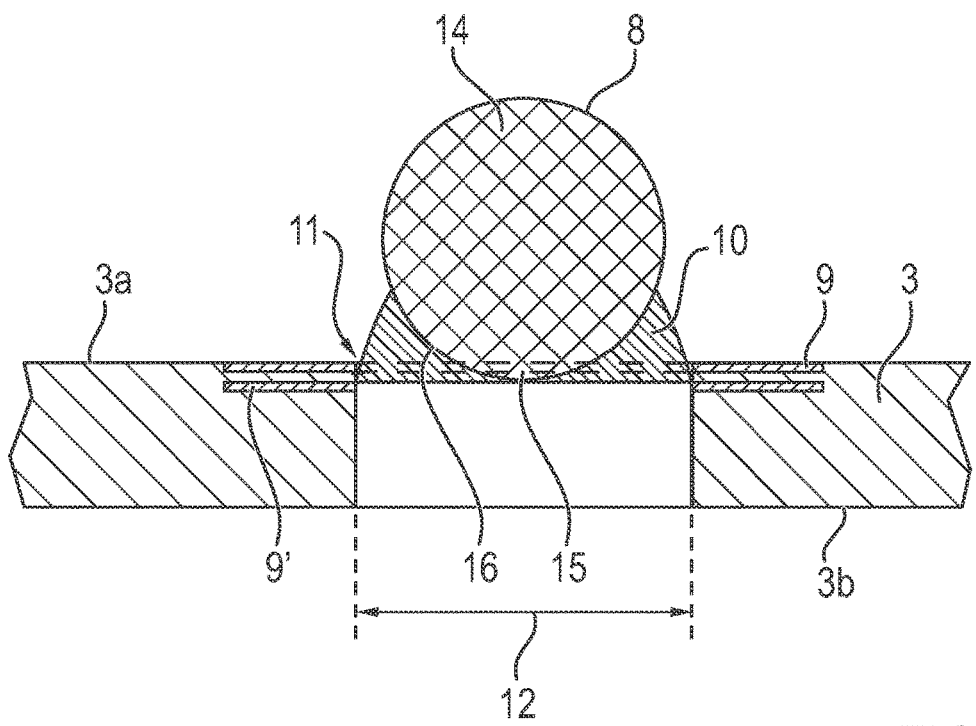
FIG. 5 is a sectional view taken along the line IV-IV shown in FIG. 4.

In the alternative embodiment according to FIGS. 4 and 5, in the region of the solder pad 9, a second solder pad 9' parallel thereto is provided in the printed circuit board 3. The elongated slot 11 here extends below the solder pad 9 provided on the mounting side 3a, into the printed circuit board 3. The printed circuit board recess 12 is in turn provided below the inner (second) solder pad 9' which can also form the sole solder pad with the omission or elimination of the upper (first) solder pad 9.

In this variant, it is advantageous that the terminal 8 of the component 2 is electrically contacted at least with the second solder pad 9' by means of solder 10. The solder 10 can here establish just a connection between the terminal 8 and the second inner solder pad 9' (inner layer) on the printed circuit board or also only to the upper (first) solder pad 9 or to both solder pads 9, 9'. A greater current carrying capacity in the region of the soldered connection is provided as a result. In addition, the inner solder pad 9' can also be accessed from the board rear side 3b via the printed circuit board recess 12, for example for a terminal of another component.

Figure 6:
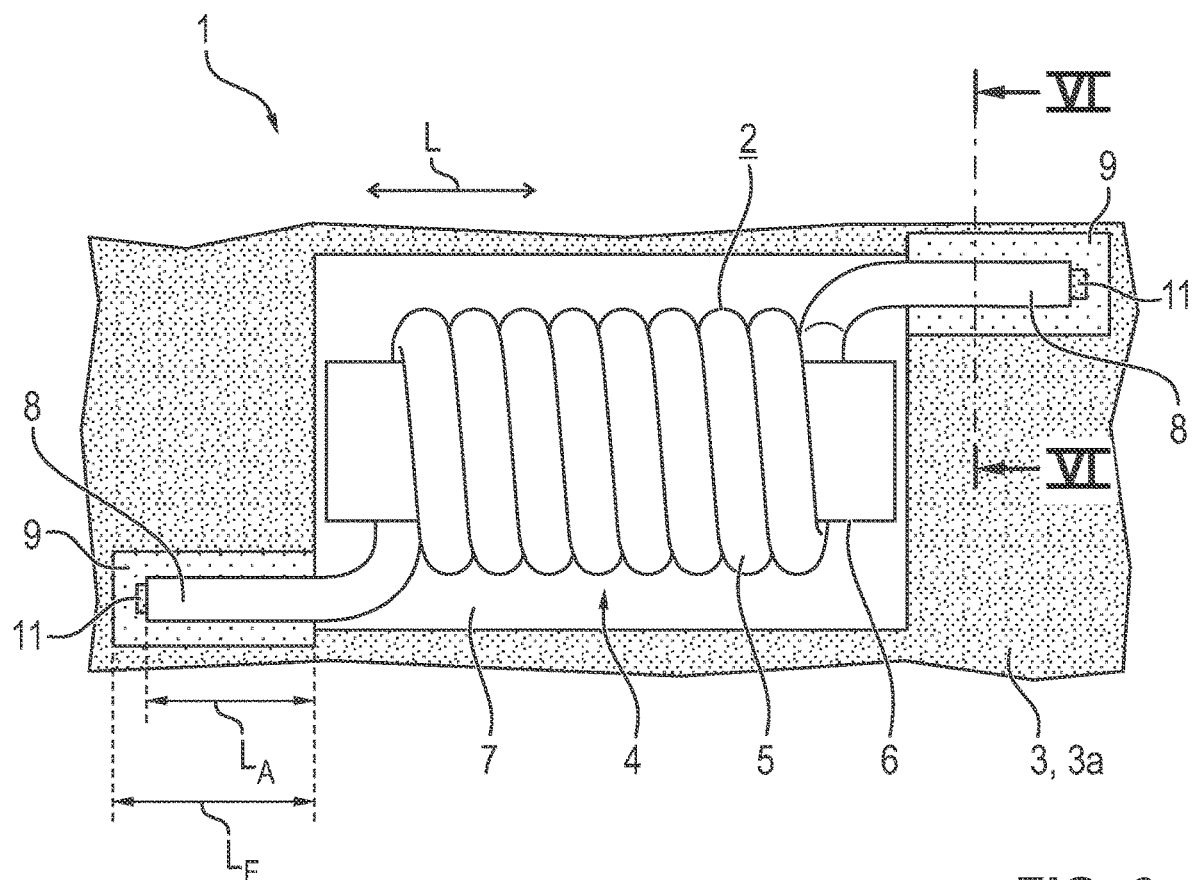
FIG. 6 is a plan view of a third embodiment of the fastening assembly of the choke coil with the coil core as the component on the printed circuit board with the slotted outer solder pad (on the surface or mounting side) for the respective component terminal.
Figure 7:
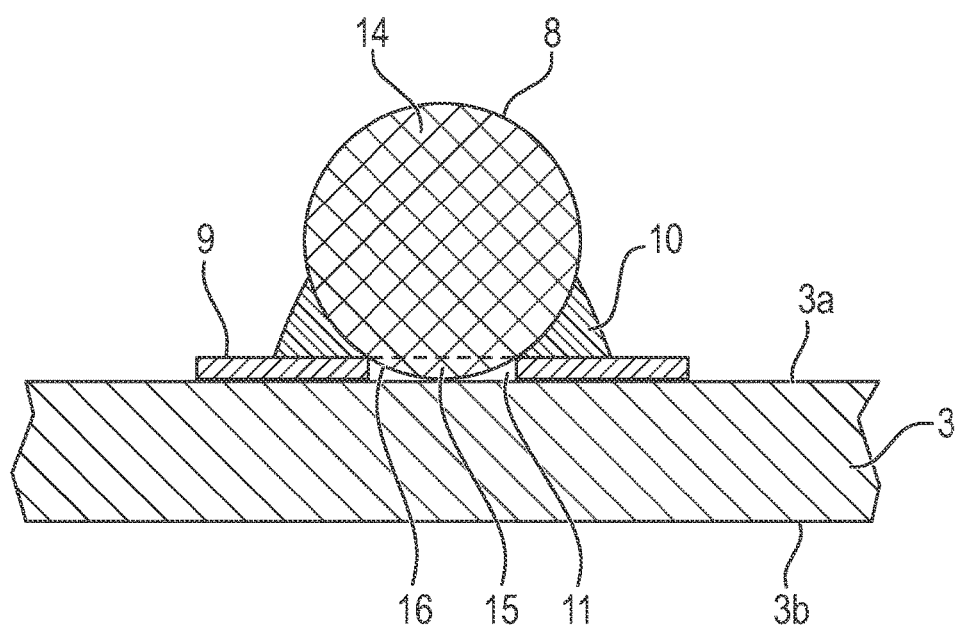
FIG. 7 is a sectional view taken along the line VI-VI shown in FIG. 6.

In the alternative embodiment according to FIGS. 6 and 7, the elongated slot 11 is provided just in the solder pad 9 and thus does not extend into the printed circuit board 3. The respective terminal 8 of the component 2 in turn has a circular terminal cross-section (cross-sectional area) 14 and lies in the elongated slot 11 with its peripheral section 15 extending in the longitudinal direction L of the terminal. In this variant too, the component 2 is positioned reliably and also as it were in self-aligning fashion in its intended position during the soldering or reflow process too.

In summary, the invention relates to a fastening assembly 1 of a circuit-board-mounted component 2, in particular a choke coil, having the component 2 with at least one terminal 8 and a printed circuit board 3 with at least one solder pad 9, 9' on or to which the terminal 8 of the component 2 is or can be soldered or welded, wherein an elongated slot 11, running parallel to the plane of the printed circuit board and in which the terminal 8 of the component 2 lies in particular just with a peripheral section 15 extending in the longitudinal direction L of the terminal or, viewed in cross-section, with a terminal edge 16, is provided in the region of the solder pad 9, 9'.

The claimed invention is not limited to the above-described exemplary embodiments. Instead, other variants of the invention can also be deduced therefrom by a person skilled in the art within the scope of the disclosed claims without departing from the subject matter of the claimed invention. In particular, all the individual features described in the context of the different exemplary embodiments can moreover be combined in a different fashion within the scope of the disclosed claims without departing from the subject matter of the claimed invention.

The component 2 can thus also be an electrolytic capacitor with two terminals 8. In this case, its two terminals 8 are routed, on the same side of the window-like recess 7, out of the latter and there in each case to a solder pad 9, 9' of the printed circuit board 3 at the edge.

In addition, the described solution can be employed in different implementations of motor vehicle applications such as, for example, in the case of door and tailgate systems, window lifters, vehicle locks, adjustable seat and interior systems, and electrical drives, control systems, sensors, and their arrangement in the vehicle.

The following is a summary list of reference numerals and the corresponding structure used in the above description of the invention.

LIST OF REFERENCE SIGNS 1 fastening assembly
2 component/part
3 printed circuit board
3a board upper/mounting side
3b board rear side
4 base body
5 coil/coil winding
6 iron/coil core
7 recess
8 terminal
9, 9' solder pad
10 solder
11 elongated slot
12 printed circuit board recess
13 metal layer
14 terminal cross-section
15 peripheral section
16 terminal edge
17 slot edge
L longitudinal direction of the terminal
LA length of the terminal section
LF length of the solder pad

The invention claimed is:

1. A fastening assembly of a circuit-board-mounted component, the fastening assembly comprising:
  a component selected from the group consisting of an electrical component and an electronic component, said component having a base body and at least one terminal;
  a printed circuit board with a mounting side for said component and with a board rear side situated opposite said mounting side, and with at least one solder pad at which said at least one terminal of said component is electrically contacted by means of solder; and
  said at least one solder pad having an elongated slot formed therein and running parallel to a plane of said printed circuit board, and in said elongated slot said at least one terminal of said component lies with a peripheral section extending in a longitudinal direction of said at least one terminal; and
  said printed circuit board having a window-shaped recess formed therein and said base body of said component sitting in said window-shaped recess, wherein said at least one terminal is routed out of said window-shaped recess to bear against said elongated slot of said at least one solder pad disposed in a region of an edge section of said window-shaped recess.

2. The fastening assembly according to claim 1, wherein said at least one terminal of said component has a circular terminal cross-section.

3. The fastening assembly according to claim 1, wherein said printed circuit board has a recess formed therein in a region of said elongated slot of said at least one solder pad.

4. The fastening assembly according to claim 3, wherein said recess in said printed circuit board and/or said board rear side has a metal layer on an edge of said recess.

5. The fastening assembly according to claim 1, further comprising a second solder pad, wherein in a region of said at least one solder pad, said second solder pad is disposed parallel to said at least one solder pad on said printed circuit board.

6. The fastening assembly according to claim 5, wherein said at least one terminal of said component is electrically contacted with said second solder pad.

7. The fastening assembly according to claim 1, wherein said at least one terminal of said component bears against at least one slot edge of said elongated slot.

8. The fastening assembly according to claim 1, wherein:
  said component is a choke coil having a coil winding which forms said base body and coil ends of said coil winding form said at least one terminal of said component; and/or
  said component is a choke coil with a coil core and a coil winding, said choke coil with said coil winding, forms said base body.

9. An electric motor, in particular a cooling fan motor of a motor vehicle, comprising:
  a fastening assembly according to claim 1.

10. The electric motor according to claim 9, wherein the electric motor is a cooling fan motor of a motor vehicle.

* * * * *